United States Patent
Doi (10) Patent No.: US 9,451,215 B2
(45) Date of Patent: Sep. 20, 2016

(54) CONTROL CIRCUIT APPARATUS AND ENDOSCOPE APPARATUS

(71) Applicant: OLYMPUS CORPORATION, Shibuya-ku, Tokyo (JP)

(72) Inventor: Ayumi Doi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 913 days.

(21) Appl. No.: 13/723,809

(22) Filed: Dec. 21, 2012

(65) Prior Publication Data
US 2013/0169776 A1    Jul. 4, 2013

(30) Foreign Application Priority Data
Dec. 28, 2011  (JP) .................................. 2011-287127

(51) Int. Cl.
 *H04N 7/18*   (2006.01)
 *H05K 1/02*   (2006.01)
 *G02B 23/24*  (2006.01)

(52) U.S. Cl.
 CPC ............ *H04N 7/18* (2013.01); *G02B 23/2492* (2013.01); *H05K 1/0203* (2013.01); *H01L 2924/00* (2013.01)

(58) Field of Classification Search
 CPC   G02B 23/2492; H04N 7/18; H01L 2924/00; H05K 1/0203
 USPC ................ 348/68, 76, 82; 361/765; 257/712
 See application file for complete search history.

(56) References Cited

U.S. PATENT DOCUMENTS

| | | | |
|---|---|---|---|
| 5,838,547 A * | 11/1998 | Gane .................... | H01R 9/2641 338/195 |
| 8,194,380 B2 | 6/2012 | Murata et al. | |
| 2003/0178229 A1* | 9/2003 | Toyoda ................ | H01L 21/486 174/261 |
| 2007/0177010 A1 | 8/2007 | Murata | |
| 2009/0056911 A1* | 3/2009 | Hongo .................... | G06F 1/203 165/80.4 |
| 2009/0230487 A1* | 9/2009 | Saitoh .................. | B81B 7/0061 257/419 |

FOREIGN PATENT DOCUMENTS

| | | |
|---|---|---|
| JP | 06038224 U | 5/1994 |
| JP | 10-190199 A | 7/1998 |
| JP | 2007-152020 A | 6/2007 |

(Continued)

OTHER PUBLICATIONS

Extended European Search Report (EESR) dated Apr. 18, 2013 (in English) issued in counterpart European Application No. 12199007.1.

(Continued)

*Primary Examiner* — Matthew Kwan
(74) *Attorney, Agent, or Firm* — Holtz, Holtz & Volek PC (57) ABSTRACT

In a control circuit apparatus and an endoscope apparatus circuit disposition in which the outer edge of the first overheating region and the outer edge of the second overheating region approach the outer edge of the first overheating region and the outer edge of the second overheating region to an extreme in a state in which the outer edge of the first overheating region and the outer edge of the second overheating region do not overlap the outer edge of the first overheating region and the outer edge of the second overheating region serves as circuit disposition having a minimum mounting area on a substrate.

6 Claims, 8 Drawing Sheets

(56) References Cited

FOREIGN PATENT DOCUMENTS

| | | |
|---|---|---|
| JP | 2008237914 A | 10/2008 |
| JP | 2010-154708 A | 7/2010 |
| WO | WO 2010/103426 A1 | 9/2010 |

OTHER PUBLICATIONS

Notice of Allowance (and English translation thereof) dated Jul. 5, 2016, issued in counterpart Japanese Application No. 2011-287127.

* cited by examiner

CONTROL CIRCUIT APPARATUS AND ENDOSCOPE APPARATUS

BACKGROUND OF THE INVENTION

1. Field of the Invention

The present invention relates to a control circuit apparatus and an endoscope apparatus.

Priority is claimed on Japanese Patent Application No. 2011-287127, filed on Dec. 28, 2011, the content of which is incorporated by reference herein.

2. Description of Related Art

In the related art, an endoscope apparatus configured to observe a place such as the inside of an observation object, the inside of which an observer cannot easily directly observe, is well known. The endoscope apparatus includes a long insertion section, and an image acquisition unit installed at a distal end of the insertion section.

The endoscope apparatus is generally classified as a medical endoscope configured to observe the inside of a human body, or an industrial endoscope configured to observe the inside of a machine.

The industrial endoscope may be used in environments in which an explosive atmosphere is likely to be filled, such as a boiler, a chemical plant, or an engine of an automobile or an aircraft. For example, an endoscope apparatus that is assumed to be used in environments surrounded by a combustible gas or dust is disclosed in Japanese Unexamined Patent Application, First Publication No. 2007-152020.

According to the endoscope apparatus disclosed in Japanese Unexamined Patent Application, First Publication No. 2007-152020, since a control unit, an insertion unit, and an optical adaptor have an intrinsically safe explosion-proof construction, the endoscope apparatus can be used in a place in which an explosion hazard is present.

In addition, Japanese Unexamined Patent Application, First Publication No. 2010-154708 discloses that, as a resin is filled into a substrate in which electronic parts having a large calorific value are mounted, a combustible is prevented from coming in contact with the electronic parts.

SUMMARY OF THE INVENTION

A control circuit board according to a first aspect of the present invention includes a substrate; a plurality of barrier circuits mounted on the substrate; a heat-resistant resin configured to cover at least a portion of each of the plurality of barrier circuits; and a filler configured to cover all of the substrate, the plurality of barrier circuits, and the heat-resistant resin. A first compartment in which a first barrier circuit among the plurality of barrier circuits is disposed, and a second compartment adjacent to the first compartment and in which a second barrier circuit different from the first barrier circuit among the plurality of barrier circuits is disposed, are formed in the substrate. The first barrier circuit has at least a first part having a relatively small surface area and a relatively large assumed maximum calorific value upon malfunction condition, and a second part having a relatively large surface area and a relatively small assumed maximum calorific value upon malfunction condition. While in a malfunction condition of the first barrier circuit, the first part is disposed at a position spaced further apart from the second compartment than the second part such that distances from an outer edge of the second compartment to a point nearest the second compartment of an outer edge of a region in which a temperature of the substrate exceeds an upper limit temperature among rated temperatures of the substrate due to heat generation of the first part and a point nearest the second compartment of an outer edge of a region in which the temperature of the substrate exceeds the upper limit temperature of the rated temperatures of the substrate due to heat generation of the second part are substantially equal to each other.

In addition, according to a second aspect of the present invention, in the control circuit board according to the first aspect, the second barrier circuit may have at least a first part having a relatively small surface area and a relatively large assumed maximum calorific value upon malfunction condition, and a second part having a relatively large surface area and a relatively small assumed maximum calorific value upon malfunction condition. In this case, while in a malfunction condition of the second barrier circuit, the first part of the second barrier circuit may be disposed at a position spaced further apart from the first compartment than the second part of the second barrier circuit such that distances from an outer edge of the first compartment to a point nearest the first compartment of an outer edge of a region in which the temperature of the substrate exceeds the upper limit temperature among the rated temperatures of the substrate due to heat generation of the first part of the second barrier circuit and a point nearest the first compartment of an outer edge of a region in which the temperature of the substrate exceeds the upper limit temperature among the rated temperatures of the substrate due to heat generation of the second part of the second barrier circuit are substantially equal to each other.

In addition, according to a third aspect of the present invention, in the control circuit board according to the first aspect, while the first part of the second barrier circuit may be a part having the same specification as of the first part of the first barrier circuit, rather than the first part itself of the first barrier circuit.

Further, according to a fourth aspect of the present invention, in the control circuit board according to the first aspect, while the second part of the second barrier circuit may be a part having the same specification as of the second part of the first barrier circuit, rather than the second part itself of the first barrier circuit.

In addition, according to a fifth aspect of the present invention, the control circuit board according to the first aspect may have a filling frame formed at one of both surfaces in a thickness direction of the substrate, on which the first barrier circuit is mounted, and into which the heat-resistant resin is filled, and the filling frame may be formed to surround at least the first part in the first barrier circuit.

Further, according to a sixth aspect of the present invention, the control circuit board according to the second aspect has a first filling frame formed at one of both surfaces in the thickness direction of the substrate, in which the first barrier circuit is mounted, and into which the heat-resistant resin is filled, and a second filling frame formed at one of both surfaces in the thickness direction of the substrate, in which the second barrier circuit is mounted, and into which the heat-resistant resin is filled. The first filling frame may be formed to surround at least the first part of the first barrier circuit, and the second filling frame may be formed to surround at least the first part of the second barrier circuit.

An endoscope apparatus according to a seventh aspect of the present invention includes a control circuit apparatus according to any one of first to fourth aspects of the present invention, a main body having the control circuit apparatus therein, a long insertion section having one end attached to the main body, an imaging unit installed at the other end of the insertion section and configured to image an object, an lighting unit installed at the other end of the insertion section and configured to radiate light to the object, and a control unit installed at the main body and configured to control the imaging unit and the lighting unit. The control unit has an imaging control unit configured to receive power from one barrier circuit of the plurality of barrier circuits and operate the imaging unit, and an lighting control unit configured to receive power from another barrier circuit of the plurality of barrier circuits and operate the lighting unit.

According to an eighth aspect of the present invention, in the control circuit apparatus of the seventh aspect, the one barrier circuit may be one of the first barrier circuit and the second barrier circuit, and the other barrier circuit may be the other of, the first barrier circuit and the second barrier circuit.

In addition, according to a ninth aspect of the present invention, in the control circuit apparatus of the seventh aspect, the heat-resistant resin may be disposed at two or more different places on the substrate.

DETAILED DESCRIPTION OF THE INVENTION

Figure 1:
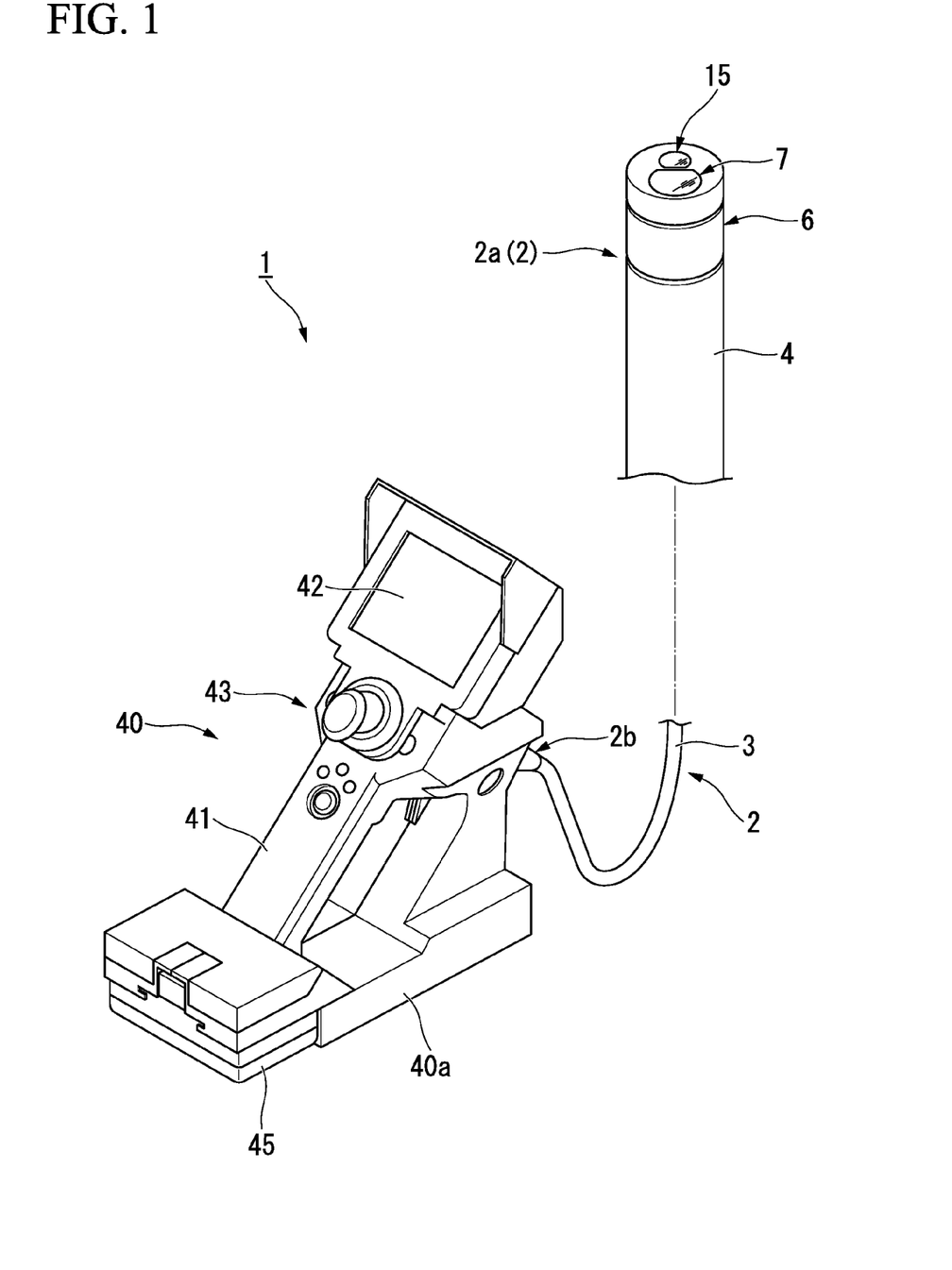
FIG. 1 is a perspective view showing an endoscope apparatus of an embodiment of the present invention.
Figure 2:
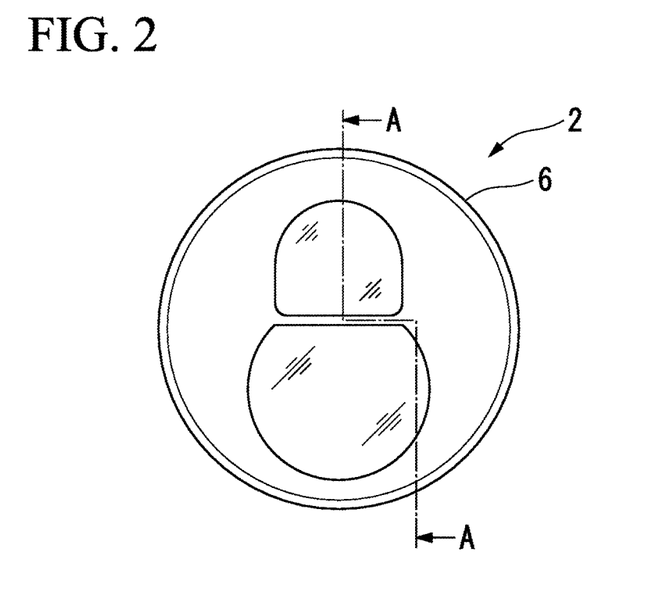
FIG. 2 is a front view showing an insertion section of the endoscope apparatus.
Figure 3:
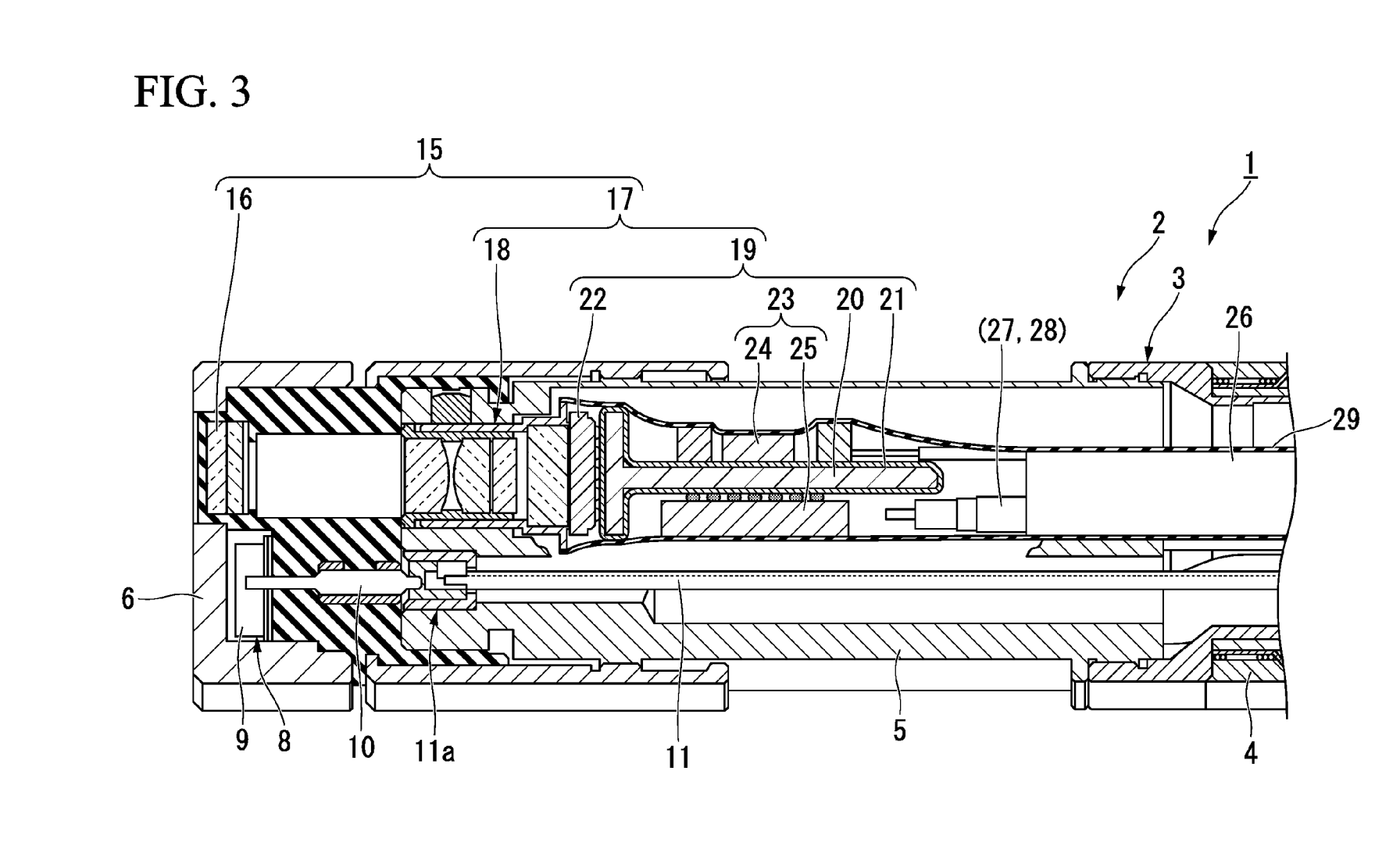
FIG. 3 is a cross-sectional view taken along line A-A of FIG. 2.
Figure 4:
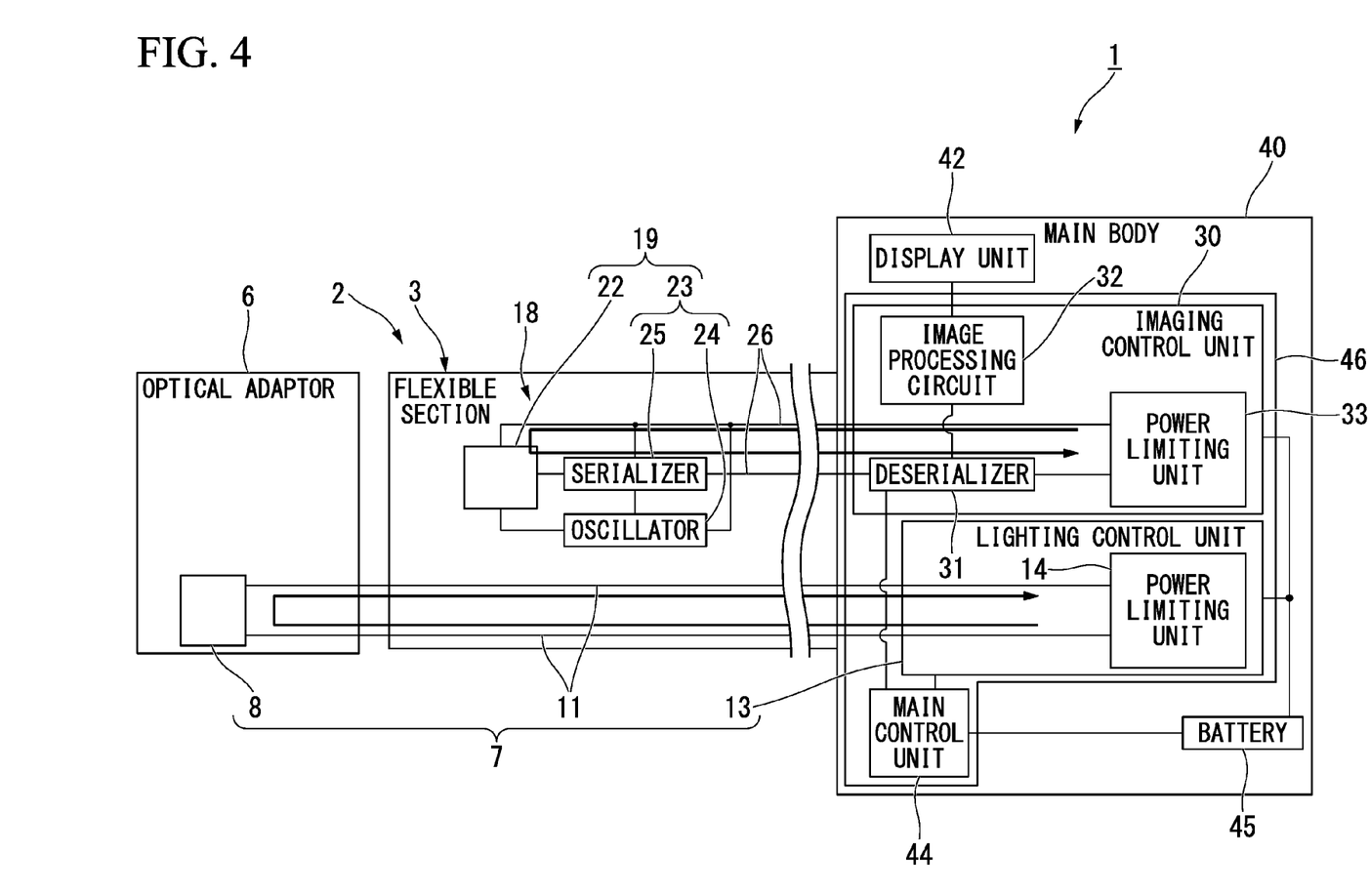
FIG. 4 is a block diagram showing the endoscope apparatus.

An endoscope apparatus including a control circuit apparatus of an embodiment of the present invention will be described. FIG. 1 is a perspective view showing an endoscope apparatus of the embodiment. FIG. 2 is a front view showing an insertion section of the endoscope apparatus of the embodiment. FIG. 3 is a cross-sectional view taken along line A-A of FIG. 2. FIG. 4 is a block diagram of the endoscope apparatus of the embodiment.

An endoscope apparatus 1 shown in FIG. 1 is an apparatus configured to observe a place such as the inside of an observation object, the inside of which an observer cannot easily directly observe. As shown in FIG. 1, the endoscope apparatus 1 includes a long insertion section 2 inserted into the observation object from a distal end 2a thereof, and a main body 40 fixed to a proximal end 2b of the insertion section 2.

The insertion section 2 includes a cylindrical flexible section 3 having flexibility, and an optical adaptor 6 detachably attached to the flexible section 3 at the distal end 2a. An lighting unit 7 configured to radiate illumination light to the observation object and an image acquisition unit 15 configured to acquire an image of the observation object irradiated with the illumination light are installed in the insertion unit 2. In the embodiment, the lighting unit 7 and the image acquisition unit 15 are disposed inside the optical adaptor 6, the flexible section 3, and the main body 40.

As shown in FIGS. 1 and 3, a bending unit 4 configured to bend the flexible section 3 and a distal end hard member 5 configured to support the lighting unit 7 and the image acquisition unit 15 at a distal end side of the bending unit 4 are installed at a distal end of the flexible section 3. The distal end hard member 5 is formed of, for example, metal or resin, and has a substantially circular column shape having a center axis in a central axial direction of the insertion section 2. The distal end hard member 5 has a through-hole into which the lighting unit 7 is inserted, and a through-hole into which the image acquisition unit 15 is inserted.

As shown in FIGS. 2 and 3, the optical adaptor 6 is an adaptor configured to protect a distal end surface of the flexible section 3, or change light distribution of the lighting unit 7 or a viewing angle of the image acquisition unit 15. In the embodiment, a direct viewing type adaptor in which an imaging field of vision is directed in the central axial direction of the insertion section 2 is employed as an example of the optical adaptor 6. A so-called lateral viewing type adaptor, in which an imaging field of vision is directed in a direction crossing a central axis of the insertion section 2, may be employed as the optical adaptor 6.

As shown in FIGS. 3 and 4, the lighting unit 7 includes a light emission unit 8 installed in the optical adaptor 6, an interconnection 11 disposed in the flexible section 3 to supply driving power to the light emission unit 8, and an lighting control unit 13 installed in the main body 40.

The light emission unit 8 has a light source 9 constituted by, for example, a light emitting diode (LED) or a laser diode (LD), and a contactor 10 electrically connected to the light source 9.

The interconnection 11 has a distal end disposed at the distal end of the flexible section 3, and a proximal end disposed in the main body 40. A connecting terminal 11a installed to be exposed to the distal end surface of the flexible section 3 is fixed to the distal end of the interconnection 11. A contact member having spring characteristics protruding in a central axial direction of the insertion section 2 is installed at the contactor 10. When the optical adaptor 6 is attached to the insertion section 2, the light emission unit 8 and the interconnection 11 are electrically connected to each other via the contactor 10 and the connecting terminal 11a.

As shown in FIGS. 3 and 4, the image acquisition unit 15 includes an optical adaptor object optical system 16 installed to be exposed to the distal end surface of the optical adaptor 6, an imaging unit 17 disposed in the distal end of the insertion section 2, an interconnection 26 having a distal end connected to the imaging unit 17 and a proximal end disposed in the main body 40, and an imaging control unit 30 connected to the proximal end of the interconnection 26 and installed in the main body 40.

As shown in FIGS. 2 and 3, the optical adaptor object optical system 16 is a plate-shaped member having optical transparency, and is installed to change a direction of a field of vision or a viewing angle of an observation image, and observation depth. As shown in FIG. 3, the imaging unit 17 has an object optical system 18 and an imaging circuit unit 19.

The object optical system 18 is an optical system configured to guide external light passing through the optical adaptor object optical system 16 to the imaging circuit unit 19, and is installed to acquire an image of the observation object in the imaging circuit unit 19.

The imaging circuit unit 19 has a support 20, a circuit substrate 21, an imaging device 22, and an image transmission unit 23.

The support 20 is formed of, for example, resin or metal in a predetermined shape, and supports the circuit substrate 21 and respective electronic parts mounted in the circuit substrate 21.

The circuit substrate 21 is a substrate on which a predetermined interconnection pattern is formed, and in the embodiment, is a flexible printed board. The circuit substrate 21 is fixed to an outer surface of the support 20.

The imaging element 22 is an electronic part mounted on the circuit substrate 21, and is disposed on an optical axis of the object optical system 18. For example, a CCD image sensor (charge coupled device image sensor) or a CMOS image sensor (complementary metal oxide semiconductor image sensor) may be employed as the imaging element 22.

The image transmission unit 23 is mounted on the circuit substrate 21. The image transmission unit 23 includes an oscillator 24 configured to generate a clock signal having a predetermined frequency, and a serializer circuit 25 configured to convert image data acquired by the imaging device 22 into serial data based on the clock signal issued from the oscillator 24.

The image data converted into the serial data by the serializer circuit 25 passes through the interconnection 26 to be transmitted to the imaging control unit 30 (to be described later).

The interconnection 26 has a power line 27 configured to supply driving power from the imaging control unit 30 to the imaging circuit unit 19, and a signal line 28 configured to output a signal from the imaging circuit unit 19 to the imaging control unit 30. Driving power is supplied to the power line 27, different from the lighting control unit 13. The number and disposition of the signal line 28 are set based on a transmission type of the image transmission unit 23.

As shown in FIGS. 1 and 4, the main body 40 includes a grip unit 41 gripped by an observer who uses the endoscope apparatus 1, a display unit 42 configured to display an image acquired by the image acquisition unit 15, and a manipulation input unit 43 configured to allow the observer to manipulate an operation of the lighting unit 7 or the image acquisition unit 15. In addition, a control circuit apparatus 46 including the lighting control unit 13, the imaging control unit 30, and a main control unit 44 is installed in the main body 40. Further, a battery 45, in which power that becomes a power source of the endoscope apparatus 1 is accumulated, is installed at the main body 40.

Figure 5:
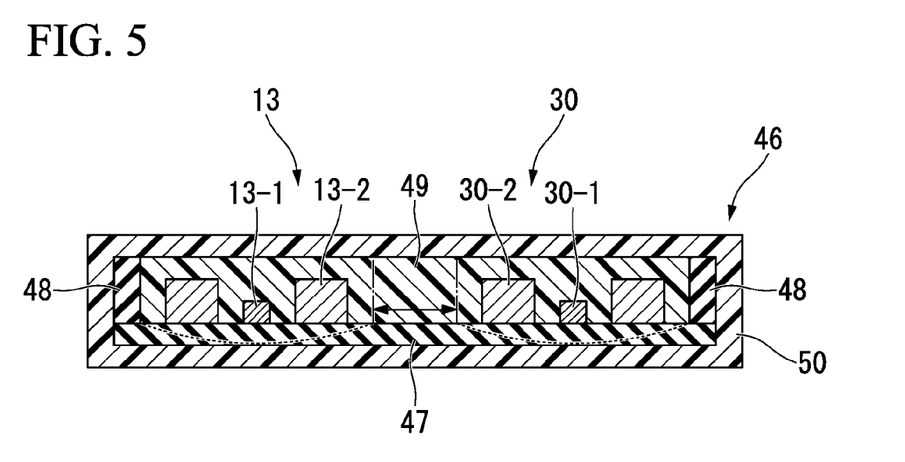
FIG. 5 is a schematic cross-sectional view showing a control circuit apparatus installed at the endoscope apparatus.
Figure 6:
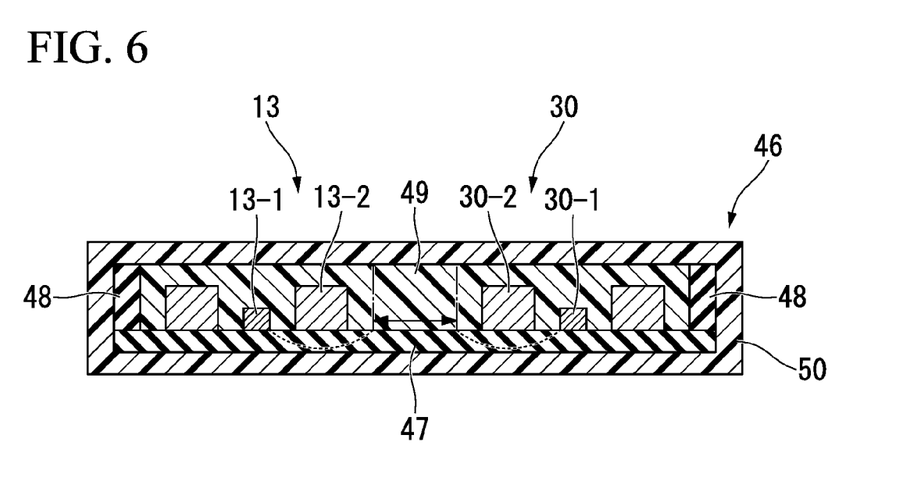
FIG. 6 is a schematic cross-sectional view showing the control circuit apparatus.
Figure 7:
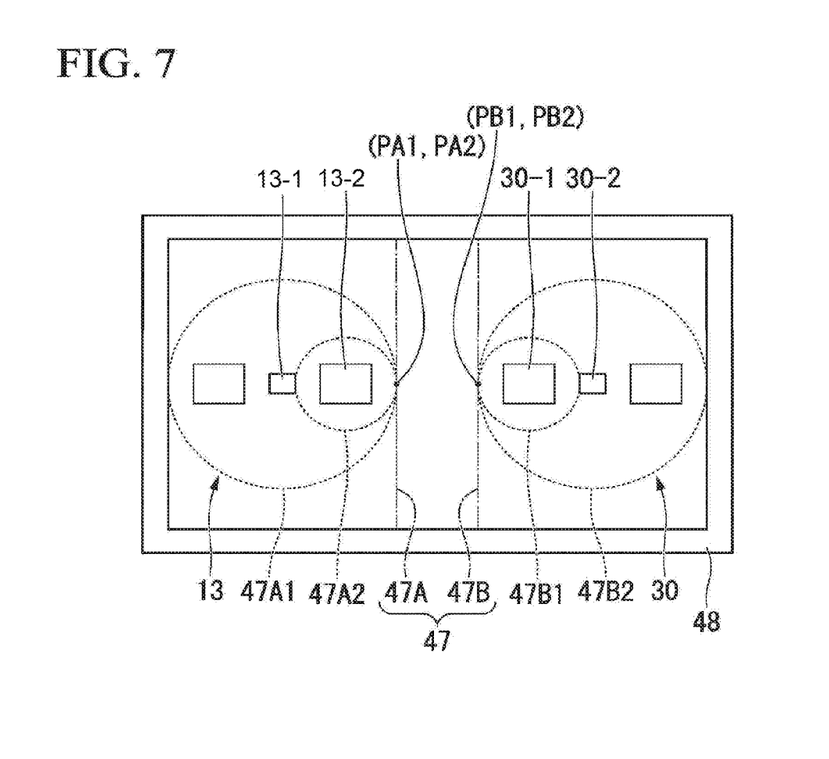
FIG. 7 is a schematic plan view showing the control circuit apparatus.

A configuration of the control circuit apparatus 46 will be described. FIG. 5 is a schematic cross-sectional view showing the control circuit apparatus 46 installed at the endoscope apparatus 1. FIG. 6 is a schematic cross-sectional view showing the control circuit apparatus 46. Distribution of heat emitted from first parts 13-1 and 30-1 (to be described later) is shown in FIG. 5, and distribution of heat emitted from second parts 13-2 and 30-2 (to be described later) is shown in FIG. 6. FIG. 7 is a schematic plan view showing the control circuit apparatus 46.

As shown in FIGS. 5 and 7, the control circuit apparatus 46 includes a substrate 47, a plurality of barrier circuits (the lighting control unit 13, the imaging control unit 30), a heat-resistant resin 49 and a filler 50, and is accommodated in a placing unit 40a, which becomes a lower end when the main body 40 shown in FIG. 1 is placed on a floor surface.

The substrate 47 is a plate-shaped member such as a glass epoxy substrate or a metal substrate, and has a predetermined interconnection structure configured to be connected to various electronic parts mounted on the substrate 47. In addition, the substrate 47 may have a heat radiation path configured to diffuse heat emitted from the electronic parts mounted on the substrate 47. An interconnection pattern or a metal base layer of the metal substrate may be employed as such a heat radiation path. A heat-resistant substrate is employed as the substrate 47. A heat-resistant temperature of the substrate 47 in the embodiment is set to 270° C.

The lighting control unit 13 and the imaging control unit 30 are mounted on the substrate 47. In addition, a compartment (a first compartment 47A) on the substrate 47 in which the lighting control unit 13 is installed, and a compartment (a second compartment 47B) on the substrate 47 in which the imaging control unit 30 is installed are spaced a predetermined spacing distance from each other. Further, in the embodiment, a filling frame 48 surrounding a region including the first compartment 47A and the second compartment 47B is installed on the substrate 47.

The lighting control unit 13 is a first barrier circuit among the plurality of barrier circuits installed at the control circuit apparatus 46 of the embodiment. The lighting control unit 13 is an electronic circuit configured to receive power from the battery 45 to be operated, and includes a power limiting unit 14 configured to limit the driving power supplied to the light emission unit 8 to a predetermined value or less in a state in which the light emission unit 8 is in a normal condition or a malfunction condition. The lighting control unit 13 is connected to the main control unit 44, and is operated according to a driving signal issued from the main control unit 44. In the embodiment, the driving power supplied to the light emission unit 8 is limited by the power limiting unit 14 to satisfy an intrinsically safe explosion-proof construction (Exia) with only the lighting unit 7.

The lighting control unit 13 is an electronic circuit having a plurality of electronic parts, and surface area of these electronic parts may be different according to specifications of the electronic parts. The surface area of the electronic part installed at the lighting control unit 13 has a negative correlation with a calorific value of each the electronic parts upon malfunction condition of the lighting control unit 13. That is, as the surface area of the electronic part is reduced, the calorific value upon malfunction condition is increased.

As described above, the lighting control unit 13 has at least an electronic part (the first part 13-1) having a relatively small surface area and a relatively large assumed maximum calorific value upon malfunction condition, and an electronic part (the second part 13-2) having a relatively large surface area and a relatively small assumed maximum calorific value upon malfunction condition.

As shown in FIGS. 5 to 7, upon malfunction condition of the lighting control unit 13, a region (hereinafter referred to as "a first overheating region 47A1") in which a temperature of the substrate 47 exceeds an upper limit temperature among rated temperatures of the substrate 47 due to heat generation of the first part 13-1 becomes a substantially circular region about the first part 13-1 when seen in a thickness direction of the substrate 47. The temperature of the substrate 47 in the outer side rather than an outer edge of the first overheating region 47A1 is the upper limit temperature or less of the substrate 47, i.e., a temperature among the rated temperatures.

In addition, upon malfunction condition of the lighting control unit 13, a region (hereinafter referred to as "a second overheating region 47A2") in which a temperature of the substrate 47 exceeds the upper limit temperature among the rated temperatures of the substrate 47 due to heat generation of the second part 13-2 is a substantially circular region about the second part 13-2 when seen from the thickness direction of the substrate 47. The temperature of the substrate 47 in the outside rather than an outer edge of the second overheating region 47A2 is the upper limit temperature or less of the substrate 47, i.e., a temperature among the rated temperatures.

A point PA1 disposed nearest the second compartment 47B of the outer edge of the first overheating region 47A1 and a point PA2 disposed nearest the second compartment 47B of the outer edge of the second overheating region 47A2 have substantially equal distances measured from the outer edge of the second compartment 47B. In the embodiment, positions of the point PA1 and the point PA2 coincide with each other. In addition, in the embodiment, both of the two points PA1 and PA2 are disposed in a gap between the first compartment 47A and the second compartment 47B.

In the specification, while disposition of two electronic parts is described focusing on the two electronic parts (the first part 13-1 and the second part 13-2) of the lighting control unit 13, similar to the other electronic parts constituting the lighting control unit 13, the disposition on the substrate 47 may be determined based on a position of the outer edge of the region in which the temperature of the substrate 47 exceeds the upper limit of the rated temperature of the substrate 47 due to heat generation.

As shown in FIG. 4, the imaging control unit 30 is a second barrier circuit different from the first barrier circuit among the plurality of barrier circuits installed at the control circuit apparatus 46 of the embodiment. The imaging control unit 30 is an electronic circuit configured to receive power from the battery 45 to be operated, and includes a deserializer circuit 31 configured to reconstruct image data based on the serial data transmitted from the serializer circuit 25 through the interconnection 26, an image processing circuit 32 configured to display the reconstructed image data on the display unit 42 (to be described later), and a power limiting unit 33 configured to limit the driving power supplied to the imaging circuit unit 19 to a predetermined value or less in a state in which the electronic part mounted on the circuit substrate 21 is in a normal state or a malfunction condition.

The imaging control unit 30 is connected to the main control unit 44, and is operated according to the driving signal issued from the main control unit 44. In the embodiment, the driving power supplied to the imaging circuit unit 19 is limited by the power limiting unit 33 to satisfy an intrinsically safe explosion-proof construction (Exia) with only the image acquisition unit 15.

The imaging control unit 30 is an electronic circuit having a plurality of electronic parts, and surface areas of these electronic parts may be different according to specifications of the electronic parts. The surface area of the electronic part installed at the imaging control unit 30 has a negative correlation with a calorific value of each of the electronic parts upon malfunction condition of the imaging control unit 30. That is, as the surface area of the electronic part is reduced, the calorific value upon malfunction condition is increased.

As described above, the imaging control unit 30 has at least an electronic part (the first part B30-1) having a relatively small surface area and a relatively large assumed maximum calorific value upon malfunction condition and an electronic part (the second part 30-2) having a relatively large surface area and a relatively small assumed maximum calorific value upon malfunction condition.

Upon malfunction condition of the imaging control unit 30, a region (hereinafter referred to as "a first overheating region 47B1") in which a temperature of the substrate 47 exceeds the upper limit temperature among the rated temperatures of the substrate 47 due to heat generation of the first part B30-1 becomes a substantially circular region about the second part when seen from the thickness direction of the substrate 47.

The temperature of the substrate 47 in the outside rather than an outer edge of the first overheating region 47B1 is the upper limit temperature or less among the rated temperatures of the substrate 47, i.e., a temperature among the rated temperatures.

In addition, upon malfunction condition of the imaging control unit 30, a region (hereinafter, "a second overheating region 47B2") in which a temperature of the substrate 47 exceeds an upper limit temperature among the rated temperatures of the substrate 47 due to heat generation of the second part 30-2 is a substantially circular region about the second part 30-2 when seen from the thickness direction of the substrate 47. The temperature of the substrate 47 in the outside rather than an outer edge of the second overheating region 47B2 is the upper limit temperature or less among the rated temperatures of the substrate 47, i.e., a temperature among the rated temperatures.

A point PB1 disposed nearest the first compartment 47A of the outer edge of the first overheating region 47B1 and a point PB2 disposed nearest the first compartment 47A of the outer edge of the second overheating region 47B2 have substantially equal distances measured from the outer edge of the first compartment 47A. In the embodiment, positions of the point PB1 and the point PB2 coincide with each other. In addition, in the embodiment, the two points PB1 and PB2 are disposed in a gap between the first compartment 47A and the second compartment 47B.

In the specification, while disposition of two electronic parts is described focusing on the two electronic parts (the first part B30-1 and the second part 30-2) of the imaging control unit 30, similar to the other electronic part constituting the imaging control unit 30, disposition on the substrate 47 may be determined based on a position of the outer edge of the region in which the temperature of the substrate 47 exceeds the upper limit temperature among the rated temperatures of the substrate 47 due to heat generation.

In addition, when another barrier circuit different from the lighting control unit 13 and the imaging control unit 30 is installed on the substrate 47, disposition of the respective barrier circuits on the substrate 47 and disposition of parts in the respective barrier circuits may be determined based on a distance from the other barrier circuit and a magnitude of heat emitted from the other barrier circuit upon malfunction condition.

The main control unit 44 includes various electronic circuits configured to control the lighting control unit 13 and the imaging control unit 30 based on the input signal from the manipulation input unit 43.

As shown in FIG. 5, the heat-resistant resin 49 is formed of a resin material filled into the inside of the filling frame 48 to cover the lighting control unit 13 and the imaging control unit 30. The heat-resistant resin 49 has a higher heat resistance than the substrate 47. An inorganic bonding agent such as alumina may be used as a material of the heat-resistant resin 49. In addition, in the embodiment, when one or both of the lighting control unit 13 and the imaging control unit 30 malfunction, a dimension of the heat-resistant resin 49 is set such that a temperature of an interface of the outer surface of the heat-resistant resin 49 in contact with the filler 50 is a rated upper limit temperature or less of the filler 50. When another barrier circuit is mounted on the substrate 47 in addition to the lighting control unit 13 and the imaging control unit 30, a dimension of the heat-resistant resin 49 may be set in consideration of heat generation from the other barrier circuit.

The filler 50 has substantially the same heat resistance as the substrate 47, and covers the entire substrate 47, the lighting control unit 13 and the imaging control unit 30 as well as the heat-resistant resin 49. In the embodiment, a heat-resistant temperature of the filler 50 is set to 200° C. The filler 50 may have higher flexibility than the heat-resistant resin 49, and the filler 50 is formed of a material having a low permeability of a gas to prevent a combustible gas from passing through the filler 50 and arriving at the electronic part on the heat-resistant resin 49 or the substrate 47.

Effects of the endoscope apparatus 1 having the above-mentioned configuration will be described.

In the endoscope apparatus 1, the respective barrier circuits (the lighting control unit 13, the imaging control unit 30, and the other barrier circuit) installed at the control circuit apparatus 46 may have different specifications such as rated driving voltages. In addition, in order to satisfy the intrinsically safe explosion-proof standard, the plurality of barrier circuits installed on the substrate 47 are electrically separated from each other. A magnitude of power supplied from the battery 45 to the respective barrier circuits is limited by the power limiting units 14 and 33.

However, upon malfunction condition of the lighting control unit 13, the imaging control unit 30, and the other barrier circuit, excessive power with respect to the electronic parts constituting the barrier circuits may be supplied from the battery 45. In this case, the electronic parts to which the excessive power is supplied are in an overheated state. Since the electronic parts in the barrier circuits that receive excessive power are variously determined according the type of malfunction condition, the electronic parts that become overheated cannot be easily specified before being malfunction condition.

As shown in FIG. 7, in the control circuit apparatus 46 of the embodiment, in the lighting control unit 13 and the imaging control unit 30, all of the first overheating regions 47A1 and 47B1 and the second overheating regions 47A2 and 47B2 have outer edges disposed between the first compartment 47A and the second compartment 47B.

Accordingly, thermal influence due to malfunction condition of the lighting control unit 13 does not reach the imaging control unit 30, and thermal influence due to malfunction of the imaging control unit 30 does not reach the lighting control unit 13.

In addition, since the outer edge of the first overheating region 47A1 and the outer edge of the second overheating region 47A2 are equidistant from the outer edge of the second compartment 47B, and the outer edge of the first overheating region 47B1 and the outer edge of the second overheating region 47B2 are equidistant from the outer edge of the first compartment 47A, in a state in which the outer edge of the first overheating region 47A1 and the outer edge of the second overheating region 47A2 do not overlap the outer edge of the first overheating region 47B1 and the outer edge of the second overheating region 47B2, circuit disposition in which the outer edge of the first overheating region 47A1 and the outer edge of the second overheating region 47A2 and the outer edge of the first overheating region 47B1 and the outer edge of the second overheating region 47B2 approach each other to an extreme while maintaining a predetermined spacing distance becomes circuit disposition in which a mounting area on the substrate 47 is minimized. The predetermined spacing distance is set based on a spacing distance defined in an explosion-proof standard.

As described above, according to the control circuit apparatus 46 and the endoscope apparatus 1 of the embodiment, as the circuit disposition focusing on positions of the outer edges of the respective overheating regions (the first overheating regions 47A1 and 47B1 and the second overheating regions 47A2 and 47B2) is provided, the substrate 47 on which the plurality of barrier circuits are mounted can be miniaturized. In addition, when one barrier circuit in the plurality of barrier circuits malfunctions, since thermal influence from the one barrier circuit does not reach the other barrier circuits, the circuit disposition can be preferably used in an explosive atmosphere.

Further, since the substrate 47 and the respective barrier circuits (the lighting control unit 13 and the imaging control unit 30) are covered by the heat-resistant resin 49, probability of the heat-resistant resin 49 breaking due to heat generation from the lighting control unit 13 or the imaging control unit 30 is reduced, and probability of a combustible gas coming in contact with the lighting control unit 13 or the imaging control unit 30 is reduced.

Further, since the substrate 47, the lighting control unit 13, the imaging control unit 30, and the heat-resistant resin 49 are hermetically sealed by the filler 50, even when cracks are generated in the heat-resistant resin 49 due to thermal expansion of bubbles in the heat-resistant resin 49, air tightness is maintained by the filler 50, and probability of the combustible gas coming in contact with the lighting control unit 13 or the imaging control unit 30 can be suppressed to a low level.

MODIFIED EXAMPLE 1

Figure 8:
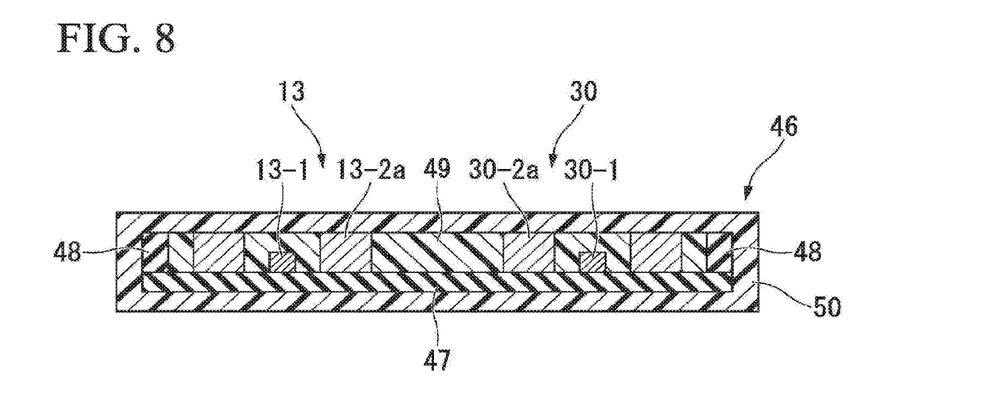
FIG. 8 is a schematic cross-sectional view showing a control circuit apparatus of a modified example of the embodiment.

Next, a modified example of the embodiment will be described. FIG. 8 is a schematic cross-sectional view showing a control circuit apparatus of the modified example.

As shown in FIG. 8, in the modified example, a shape of the filling frame 48 is different from the filling frame 48 of the control circuit apparatus 46 of the first embodiment.

In the filling frame 48 of the modified example, a height dimension in a thickness direction of the substrate 47 corresponds to a height dimension of the electronic part constituting each of the respective barrier circuits (the lighting control unit 13 and the imaging control unit 30).

That is, the height dimension of the filling frame 48 is equal to a height dimension of the electronic parts (FIG. 8 shows reference numerals 13-2a and 30-2b) having the largest height dimension upon mounting, among the electronic parts constituting the respective barrier circuits. For this reason, an upper end of the electronic part having the largest dimension upon mounting is in contact with the filler 50, while not covered by the heat-resistant resin 49.

According to the above-mentioned configuration, a charge amount of the heat-resistant resin 49 can be reduced in comparison with that of the first embodiment, and the control circuit apparatus 46 can have a compact size and a light weight.

The electronic part having the large height dimension upon mounting tends to be a part having a large surface area in comparison with the other electronic parts and a relatively small calorific value in comparison with the electronic part mounted on the substrate 47. For this reason, there is no crack generated from the filler 50 due to heat generation, and the hermetically sealed state can be sufficiently maintained by the filler 50.

In the modified example, while the example in which the upper end of the electronic part having the largest height dimension on mounting is in contact with the filler 50 has been described, a thickness dimension (a dimension measured in the thickness direction of the substrate 47) of the heat-resistant resin 49 may be reduced such that a portion of a side surface disposed at the upper end side of the electronic part comes in contact with the filler 50.

MODIFIED EXAMPLE 2

Figure 9:
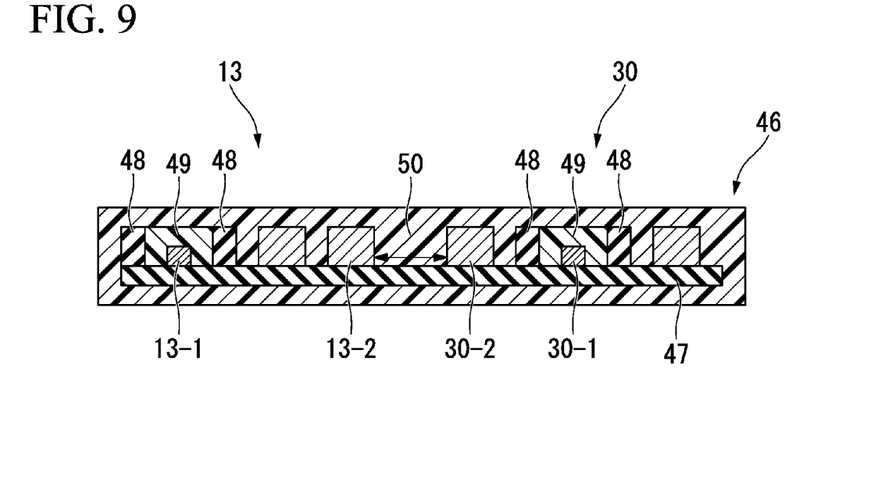
FIG. 9 is a schematic cross-sectional view showing a control circuit apparatus of another modified example of the embodiment.

Next, another modified example of the embodiment will be described. FIG. 9 is a schematic cross-sectional view showing a control circuit apparatus of the modified example.

In the modified example, a shape of the filling frame 48 is different from that of the filling frame 48 of the control circuit apparatus 46 of the first embodiment.

As shown in FIG. 9, in the modified example, the filling frame 48 is separately installed with respect to the lighting control unit 13 and an imaging control circuit 30, and the electronic part that does not exceed a heat-resistant temperature of the filler 50 and the substrate 47 even when the heat is generated to a maximum calorific value (an assumed maximum calorific value) assumed upon malfunction condition is disposed outside each of the filling frames 48.

In the modified example, since the number of parts covered by the heat-resistant resin 49 is smaller than that in the first embodiment, an amount of the heat-resistant resin 49 required to cover the electronic part may be smaller. The electronic parts which are not covered by the heat-resistant resin 49 are in contact with the filler 50 instead of the heat-resistant resin 49.

Accordingly, the control circuit apparatus 46 can be reduced in weight in comparison with that in the first embodiment.

MODIFIED EXAMPLE 3

Figure 10:
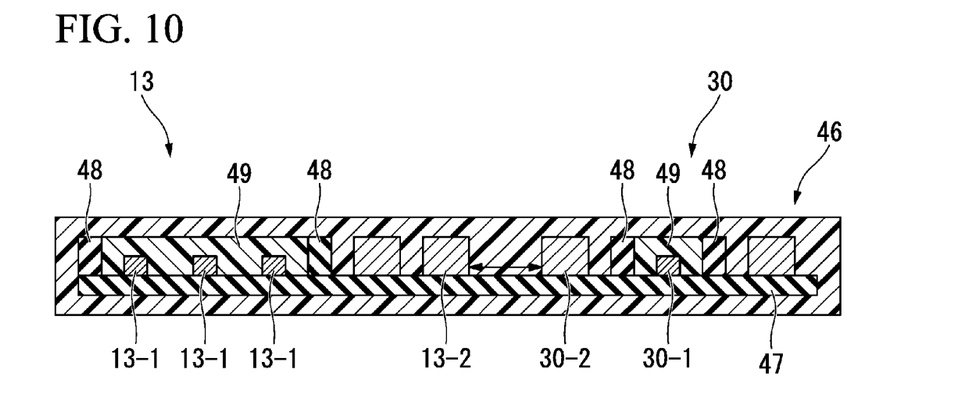
FIG. 10 is a schematic cross-sectional view showing a control circuit apparatus of still another modified example of the embodiment.

Next, still another modified example of the embodiment will be described. FIG. 10 is a schematic cross-sectional view showing a control circuit apparatus of the modified example.

In the modified example, similar to the modified example 2, the plurality of filling frames 48 are installed on the substrate 47, the respective filling frames 48 are configured to surround the electronic parts (for example, the first parts 13-1 and 30-1 described in the first embodiment) having a relatively large calorific value. In addition, the heat-resistant resin 49 is filled in each of the filling frames 48.

Further, in the modified example, as shown in FIG. 9, in order to adjust a weight balance of the main body 40 of the endoscope apparatus 1, circuit disposition on the substrate 47 can be optimized Optimization of the circuit disposition in the modified example is to use a capacity of each of the filling frames 48 as a minimal capacity configured to cover the electronic parts having a large calorific value, similarly to the modified example 2, and to use the heat-resistant resin 49 filled in each of the filling frames 48 as a balance weight configured to adjust a center position of the main body 40.

For example, in the first barrier circuit (for example, the lighting control unit 13) and the second barrier circuit (for example, the imaging control unit 30), when the number of parts having relatively large calorific values are different from each other, the barrier circuit (in FIG. 10, the lighting control unit 13) having a large number of parts having a relatively large calorific value should be covered using a larger amount of heat-resistant resin 49 than the barrier circuit having a small number of parts having a relatively large calorific value, increasing the weight thereof. In the variant, upon design of the endoscope apparatus 1, in addition to adjustment of a center position by disposition of components other than the control circuit apparatus 46, adjustment of the position in the main body 40 of the control circuit apparatus 46 and a position of the heat-resistant resin 49 on the substrate 47 is performed, and a center of the endoscope apparatus 1 can be adjusted to be at a predetermined position.

For example, when all of the respective barrier circuits are covered by the heat-resistant resin 49, a ratio of the weight of the heat-resistant resin in the total weight of the main body 40 may be about 30% to 40%. In addition, when some of the respective barrier circuits are covered by the heat-resistant resin 49, a ratio of the weight of the heat-resistant resin 49 in the total weight of the main body 40 may be about 20% to 30%. When the heat-resistant resin 49 is included at the ratio, balance adjustment is possible to be performed such that a manipulation feeling transmitted to an operator who uses the endoscope apparatus 1 is possible to be varied through only variation in disposition of the heat-resistant resin 49.

In addition, the position of the heat-resistant resin 49 in the first barrier circuit (for example, the lighting control unit 13) and the position of the heat-resistant resin 49 in the second barrier circuit (for example, the imaging control unit 30) is possible to be set independently from each other.

According to the above-mentioned configuration, the weight balance of the endoscope apparatus 1 is possible to be easily accomplished. In addition, since the position of the heat-resistant resin 49 is possible to be adjusted to set the weight balance of the endoscope apparatus 1, when an instrument configuration in the main body 40 is limited due to deviation of the weight balance of the endoscope apparatus 1 from a very appropriate balance, the limit is possible to be attenuated.

Hereinabove, while the embodiment of the present invention has been described with reference to the accompanying drawings, the specific configuration is not limited to the embodiment but may include a design change without departing from the spirit of the present invention.

Figure 11:
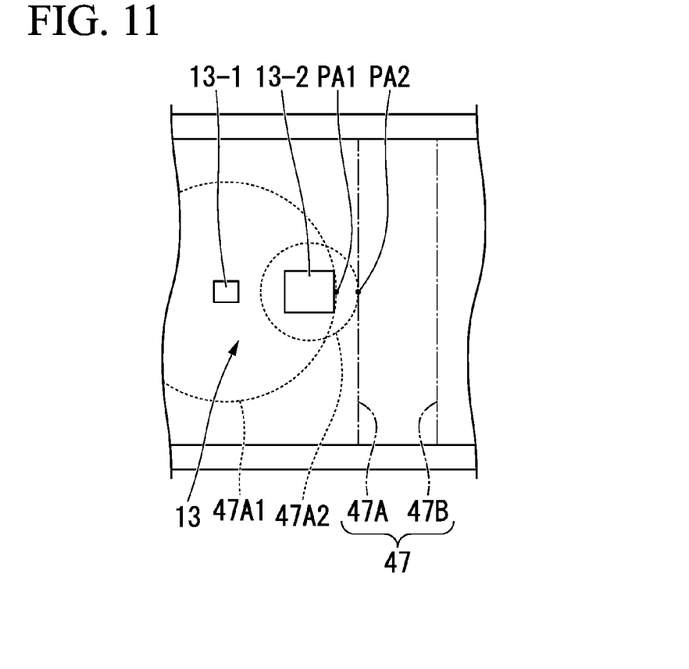
FIG. 11 is a schematic view showing an example of a design change with respect to the embodiment.

For example, even when the position of the first overheating region 47A1 with respect to the position of the second overheating region 47A2 shown in FIG. 7 is slightly deviated from a positional relation in which positions of the point PA1 and the point PA2 coincide with each other, a distance from the outer edge of the second compartment 47B to the point PA1 is substantially equal to a distance from the outer edge of the second compartment 47B to the point PA2. For example, as shown in FIG. 11, as an example of such a case, the case in which the entire second part 13-2 is inserted into the first overheating region 47A1 when seen from the thickness direction of the substrate 47 is exemplified.

Figure 12:
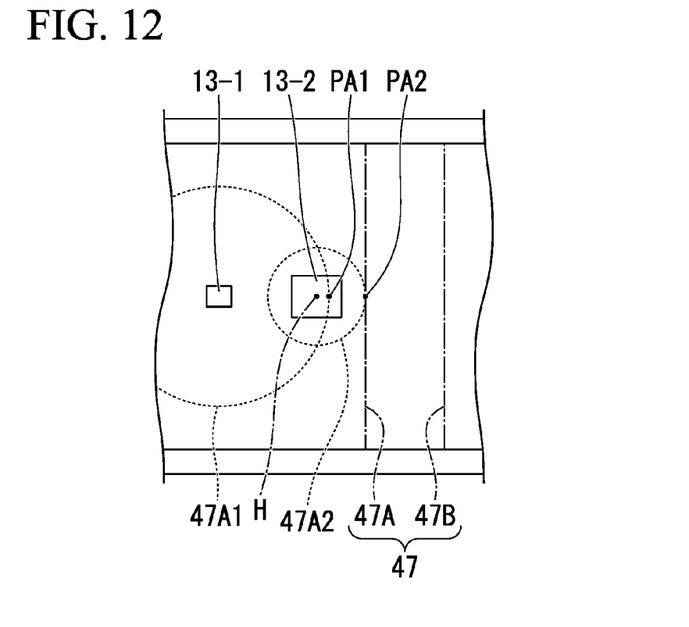
FIG. 12 is a schematic view showing an example of another design change with respect to the embodiment.

In addition, for example, as shown in FIG. 12, when a heat generation center H (a point having the highest temperature upon overheating in the second part, for example, a position of a silicon substrate or a resistor in a package of the second part) upon overheating of the second part can be assumed, the second overheating region 47A2 becomes a circular outer edge about the heat generation center H. In this case, when the heat generation center H is positioned in the first overheating region 47A1, a distance from the outer edge of the second compartment 47B to the point PA1 is substantially equal to a distance from the outer edge of the second compartment 47B to the point PA2.

The design change is not limited to the example.

In addition, the components shown in the above-mentioned embodiment and the respective variants may be appropriately combined and configured.

Hereinabove, while the exemplary embodiment of the present invention has been described, the present invention is not limited to the embodiment. Addition, omission, substitution and other modifications of the components may be possible. The present invention is not limited to the above-mentioned description but may be limited by only the spirit of the following claims.

What is claimed is:

1. A control circuit apparatus, comprising:
    a substrate;
    a plurality of barrier circuits mounted on the substrate;
    a heat-resistant resin configured to cover at least a portion of each of the plurality of barrier circuits; and
    a filler configured to cover all of the substrate, the plurality of barrier circuits, and the heat-resistant resin,
    wherein a first compartment in which a first barrier circuit among the plurality of barrier circuits is disposed, and a second compartment adjacent to the first compartment and in which a second barrier circuit different from the first barrier circuit among the plurality of barrier circuits is disposed, are provided on the substrate,
    wherein the first barrier circuit has a first part and a second part, the first part having a smaller surface area than the second part and a larger maximum calorific value upon a malfunction condition than the second part, and
    wherein, in the first barrier circuit, the first part is disposed at a position spaced further apart from the second compartment than the second part such that, in a malfunction condition of the first barrier circuit, distances from an outer edge of the second compartment to (i) a point nearest the second compartment of an outer edge of a region in which a temperature of the substrate exceeds an upper limit temperature among rated temperatures of the substrate due to heat generation of the first part and (ii) a point nearest the second compartment of an outer edge of a region in which the temperature of the substrate exceeds the upper limit temperature among the rated temperatures of the substrate due to heat generation of the second part, are equal to each other.

2. The control circuit apparatus according to claim 1, wherein the second barrier circuit has a first part and a second part, the first part having a smaller surface area than the second part and a larger maximum calorific value upon a malfunction condition, and wherein, in the second barrier circuit, the first part of the second barrier circuit is disposed at a position spaced further apart from the first compartment than the second part of the second barrier circuit such that, while in a malfunction condition of the second barrier circuit, distances from an outer edge of the first compartment to (i) a point nearest the first compartment of an outer edge of a region in which the temperature of the substrate exceeds the upper limit temperature among the rated temperatures of the substrate due to heat generation of the first part of the second barrier circuit and (ii) a point nearest the first compartment of an outer edge of a region in which the temperature of the substrate exceeds the upper limit temperature among the rated temperatures of the substrate due to heat generation of the second part of the second barrier circuit, are equal to each other.

3. The control circuit apparatus according to claim 1, further comprising a filling frame formed at one of two surfaces in a thickness direction of the substrate, on which the first barrier circuit is mounted, and into which the heat-resistant resin is filled, wherein the filling frame is formed to surround at least the first part in the first barrier circuit.

4. The control circuit apparatus according to claim 2, further comprising:
    a first filling frame formed at one of two surfaces in a thickness direction of the substrate, in which the first barrier circuit is mounted, and into which the heat-resistant resin is filled; and
    a second filling frame formed at one of the two surfaces in the thickness direction of the substrate, in which the second barrier circuit is mounted, and into which the heat-resistant resin is filled,
    wherein the first filling frame is configured to surround at least the first part of the first barrier circuit, and the second filling frame is configured to surround at least the first part of the second barrier circuit.

5. An endoscope apparatus, comprising:
    the control circuit apparatus according to claim 1;
    a main body having the control circuit apparatus therein;
    a long insertion section having one end attached to the main body;
    an imaging unit installed at the other end of the insertion section and configured to image an object;
    a lighting unit installed at the other end of the insertion section and configured to radiate light to the object; and
    a control unit installed at the main body and configured to control the imaging unit and the lighting unit,
    wherein the control unit has an imaging control unit configured to receive power from one barrier circuit of the plurality of barrier circuits and operate the imaging unit, and a lighting control unit configured to receive power from another barrier circuit of the plurality of barrier circuits and operate the lighting unit.

6. The endoscope apparatus according to claim 5, wherein the heat-resistant resin is disposed at two or more different places on the substrate.

* * * * *